US011004756B2

(12) United States Patent
Ohara et al.

(10) Patent No.: US 11,004,756 B2
(45) Date of Patent: May 11, 2021

(54) SEMICONDUCTOR DEVICE

(71) Applicant: Mitsubishi Electric Corporation, Tokyo (JP)

(72) Inventors: Kota Ohara, Tokyo (JP); Manabu Matsumoto, Tokyo (JP); Yoshitaka Otsubo, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 84 days.

(21) Appl. No.: 15/953,521

(22) Filed: Apr. 16, 2018

(65) Prior Publication Data
US 2019/0109059 A1    Apr. 11, 2019

(30) Foreign Application Priority Data
Oct. 11, 2017    (JP) ................................ JP2017-197913

(51) Int. Cl.
*H01L 23/049*    (2006.01)
*H01L 23/14*    (2006.01)
(Continued)

(52) U.S. Cl.
CPC .......... *H01L 23/049* (2013.01); *H01L 23/053* (2013.01); *H01L 23/142* (2013.01);
(Continued)

(58) Field of Classification Search
CPC . H01L 29/7393; H01L 23/049; H01L 23/142; H01L 23/3121; H01L 29/1608
See application file for complete search history.

(56) References Cited

U.S. PATENT DOCUMENTS 4,843,695 A * 7/1989 Doe ........................ H01L 21/50
29/827
5,519,252 A 5/1996 Soyano et al.
(Continued)

FOREIGN PATENT DOCUMENTS

DE    19518753 A1    12/1995
DE    69318658 T2    9/1998
(Continued)

OTHER PUBLICATIONS

An Office Action; "Notice of Reasons for Refusal," mailed by the Japanese Patent Office dated Aug. 25, 2020, which corresponds to Japanese Patent Application No. 2017-197913 and is related to U.S. Appl. No. 15/953,521 with English language translation.
(Continued)

*Primary Examiner* — Kenneth Parker
*Assistant Examiner* — Long H Le
(74) *Attorney, Agent, or Firm* — Studebaker & Brackett PC

(57) ABSTRACT

A semiconductor device includes: a base plate; a semiconductor chip mounted on the base plate; a case surrounding the semiconductor chip on the base plate; an electrode terminal connected to the semiconductor chip; a sealing material covering an upper face of the base plate, the semiconductor chip and a part of the electrode terminal in the case; and a lid fastened to the case above the sealing material, wherein the electrode terminal is not exposed on an upper face of the sealing material, and there is a gap between the upper face of the sealing material and a lower face of the lid.

7 Claims, 6 Drawing Sheets

(51) Int. Cl.
  *H01L 23/31* (2006.01)
  *H01L 23/053* (2006.01)
  *H01L 23/373* (2006.01)
  *H01L 25/07* (2006.01)
  *H01L 29/16* (2006.01)
  *H01L 29/739* (2006.01)
  *H01L 23/24* (2006.01)
  *H01L 23/498* (2006.01)

(52) U.S. Cl.
  CPC .......... *H01L 23/24* (2013.01); *H01L 23/3121* (2013.01); *H01L 23/3735* (2013.01); *H01L 23/49861* (2013.01); *H01L 29/1608* (2013.01); *H01L 29/7393* (2013.01); *H01L 29/7395* (2013.01); *H01L 2224/48091* (2013.01); *H01L 2224/73265* (2013.01); *H01L 2924/19107* (2013.01)

(56) References Cited

U.S. PATENT DOCUMENTS

| | | | | |
|---|---|---|---|---|
| 5,646,445 | A | * | 7/1997 | Masumoto ............. H01L 23/24 257/703 |
| 5,686,758 | A | | 11/1997 | Arai et al. |
| 5,920,119 | A | * | 7/1999 | Tamba ................. H01L 25/072 257/718 |
| 2002/0192488 | A1 | * | 12/2002 | Kurihara ............. H01L 23/142 428/621 |
| 2004/0189333 | A1 | * | 9/2004 | Dobritz ................ G01R 1/0483 324/750.05 |
| 2004/0233639 | A1 | * | 11/2004 | Upadhya ................ H01L 23/10 361/704 |
| 2006/0012032 | A1 | | 1/2006 | Paulus et al. |
| 2008/0217760 | A1 | | 9/2008 | Yoshihara et al. |
| 2010/0013085 | A1 | * | 1/2010 | Oi ....................... H01L 23/3121 257/693 |
| 2010/0127371 | A1 | * | 5/2010 | Tschirbs ................ H01L 23/13 257/684 |
| 2012/0313252 | A1 | * | 12/2012 | Ueda ..................... H01L 25/072 257/773 |
| 2013/0240909 | A1 | | 9/2013 | Hiramatsu et al. |
| 2014/0225238 | A1 | * | 8/2014 | Kimura ............. H01L 23/3107 257/666 |
| 2015/0303126 | A1 | * | 10/2015 | Takahashi ........... H01L 23/3735 257/77 |
| 2016/0118310 | A1 | * | 4/2016 | Maruyama ............ H01L 23/053 361/752 |
| 2016/0157351 | A1 | * | 6/2016 | Taya ....................... H01L 23/58 361/752 |
| 2016/0352215 | A1 | * | 12/2016 | Momose .............. H05K 5/0239 |
| 2019/0267331 | A1 | | 8/2019 | Hatanaka et al. |

FOREIGN PATENT DOCUMENTS

| | | |
|---|---|---|
| DE | 102006039975 A1 | 3/2008 |
| DE | 102008012703 A1 | 9/2008 |
| DE | 102010041892 A1 | 4/2012 |
| DE | 112011103926 T5 | 10/2013 |
| DE | 112016005409 T5 | 8/2018 |
| EP | 0791961 A2 | 8/1997 |
| EP | 1463104 A2 | 9/2004 |
| JP | H04-342158 A | 11/1992 |
| JP | H09-232512 A | 9/1997 |
| JP | 2003-086722 A | 3/2003 |
| JP | 2003-297979 A | 10/2003 |
| JP | 2004-014863 A | 1/2004 |
| JP | 2010-219419 A | 9/2010 |
| JP | 2011-243798 A | 12/2011 |
| JP | 2012-222009 A | 11/2012 |
| JP | 2016-181536 A | 10/2016 |
| JP | 2017-028159 A | 2/2017 |
| WO | 2004/073013 A2 | 8/2004 |

OTHER PUBLICATIONS

An Office Action issued by the German Patent Office dated May 9, 2020, which corresponds to German Patent Application No. 102018210855.2 and is related to U.S. Appl. No. 15/953,521; with English language translation.

An Office Action mailed by the German Patent Office dated Sep. 23, 2020, which corresponds to German Patent Application No. 10 2018 210 855.2 and is related to U.S. Appl. No. 15/953,521; with English language translation.

An Office Action mailed by the German Patent Office dated Nov. 20, 2020, which corresponds to German Patent Application No. 10 2018 210 855.2 and is related to U.S. Appl. No. 15/953,521; with English language translation.

* cited by examiner

SEMICONDUCTOR DEVICE

BACKGROUND OF THE INVENTION

Field

The present invention relates to a semiconductor device.

Background

Semiconductor devices, for example IGBT modules, used in various power electronic equipment such as general-purpose inverters must be highly reliable. Furthermore, the package form must be applicable to SiC semiconductor devices, which have a high potential for becoming the mainstream in future because of their high operating temperatures and excellent efficiency. Accordingly, direct potting resin is beginning to find applications as the material for sealing and insulating semiconductor chips and wires in a case for the purpose of improving reliability.

Direct potting resin, which is an epoxy resin containing fillers such as silica dispersed therein, is poured into a case in liquid form and hardened by applying heat. Thus, molds used for transfer molds are not necessary for the direct potting resin. In conventional semiconductor devices, the temperature on the upper surface of the resin that is exposed outside tends to become high due to the heat generated by the semiconductor chips during high-temperature operations. In one technique that has been proposed as a countermeasure, a lid is provided above the epoxy resin that seals the semiconductor chips, and lead frames are exposed from the upper face of the resin to the outside air to be cooled (see, for example, Japanese Patent Application Laid-open No. 2010-219419).

SUMMARY

However, the temperature rise on the upper surface of the device could not be sufficiently suppressed because the lead frames exposed from the upper face of the resin would become hot. There was a worry that the durability of the electronic parts mounted on a control board disposed above the device could be adversely affected. As these modules need to operate at even higher temperatures in recent years, this issue is becoming more serious.

The present invention was made to solve the problem described above and it is an object of the invention to obtain a semiconductor device capable of sufficiently suppressing the temperature rise on an upper surface of the device.

According to the present invention, a semiconductor device includes: a base plate; a semiconductor chip mounted on the base plate; a case surrounding the semiconductor chip on the base plate; an electrode terminal connected to the semiconductor chip; a sealing material covering an upper face of the base plate, the semiconductor chip and a part of the electrode terminal in the case; and a lid fastened to the case above the sealing material, wherein the electrode terminal is not exposed on an upper face of the sealing material, and there is a gap between the upper face of the sealing material and a lower face of the lid.

In present invention, the electrode terminal is not exposed on the upper face of the sealing material, and there is the gap between the upper face of the sealing material and the lower face of the lid. Thus the temperature rise of the upper surface of the device can be sufficiently suppressed.

Other and further objects, features and advantages of the invention will appear more fully from the following description.

DESCRIPTION OF EMBODIMENTS

A semiconductor device according to the Embodiments of the present invention will be described with reference to the drawings. The same components will be denoted by the same symbols, and the repeated description thereof may he omitted.

First Embodiment

Figure 1:
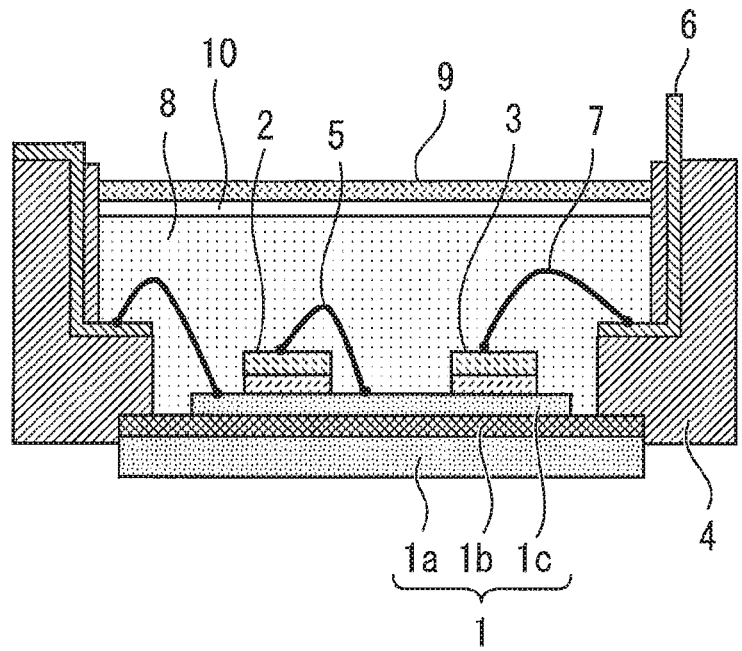
FIG. 1 is a cross-sectional view of a semiconductor device according to a first embodiment.

FIG. 1 is a cross-sectional view of a semiconductor device according to a first embodiment. A base plate 1 is a resin-insulated Cu base plate including a Cu base plate 1a, a resin insulating layer 1b, and a circuit pattern 1c stacked upon one another and formed as an integral plate.

Semiconductor chips 2 and 3 are mounted on the base plate 1. A case 4 surrounds the semiconductor chips 2 and 3 on the base plate 1. An upper surface electrode of the semiconductor chip 2 is connected to the circuit pattern 1c via an aluminum wire 5. An electrode terminal 6 provided to the case 4 is connected to the semiconductor chip 3 via an aluminum wire 7.

The interior of the case 4 is filled with a sealing material 8 by direct potting so that the sealing material 8 covers the upper face of the base plate 1, and the semiconductor chips 2 and 3, aluminum wires 5 and 7, and a part of the electrode terminal 6. The sealing material 8 is a thermosetting epoxy resin having a heat conductivity of 0.5 W/(mK) or more. Epoxy resin exhibits high adhesion with the resin-insulated Cu base plate so that delamination hardly occurs in the interface between them even when the temperature changes.

A lid 9 made of an insulating material is fastened to the case 4 above the sealing material 8 by fitting or press fitting. The electrode terminal 6 is not exposed on the upper face of the sealing material 8. The upper surface of the lid 9 exposed to the outside is the upper surface of the device. There is a gap 10 between the upper face of the sealing material 8 and the lower face of the lid 9. Although not shown, a control board configured to control the semiconductor chips 2 and 3 is disposed above the lid 9.

In this embodiment, the electrode terminal 6 is not exposed on the upper face of the sealing material 8, and there is the gap 10 between the upper face of the sealing material 8 and the lower face of the lid 9. Thus the temperature rise of the upper surface of the device can be sufficiently suppressed. Adverse effects of radiation heat on the control board attached to an upper part of the semiconductor device can accordingly be reduced.

The resin-insulated Cu base plate uses resin as the insulating material and therefore has a lower heat conductivity as compared to ceramic substrates. If the base plate 1 is a resin-insulated Cu base plate, the base plate 1 conducts less heat to the lower part of the device. Epoxy resin has higher heat conductivity as compared to silicone gel. If the sealing material 8 is epoxy resin, the sealing material 8 conducts heat well to the upper surface of the device. The temperature can readily rise on the upper surface of the device in such cases, and therefore the structure of this embodiment is particularly effective.

The lid 9 is made of a poly phenylene sulfide (PPS) resin, for example. Gas barrier properties and chemical resistance are thereby enhanced. The lid 9 may alternatively be a metal sheet, or an insulating material in which a metal sheet is provided. The temperature rise on the upper surface of the device can be suppressed even more by the heat-shielding effect of metal.

Second Embodiment

Figure 2:
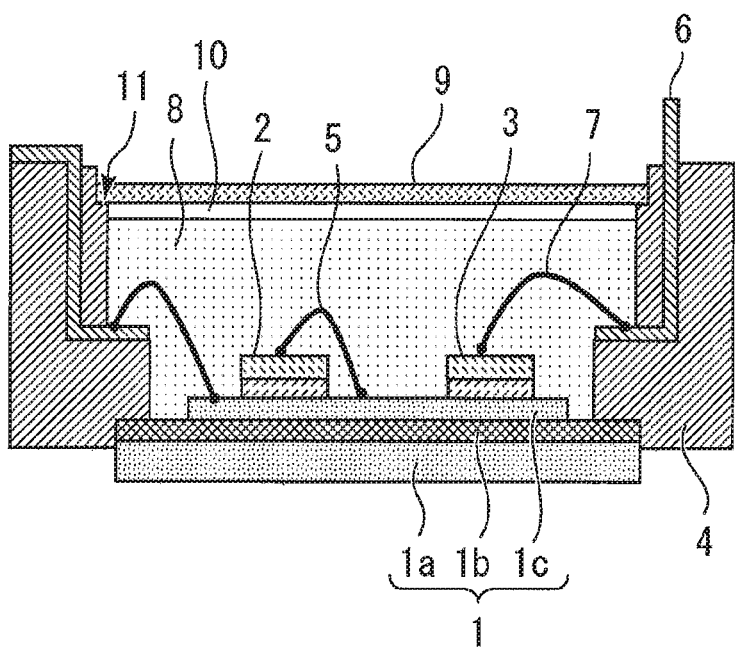
FIG. 2 is a cross-sectional view illustrating a semiconductor device according to a second embodiment.

FIG. 2 is a cross-sectional view illustrating a semiconductor device according to a second embodiment. A step 11 is provided on an inner side face of the case 4 for fixing the lid 9. The lid 9 is thus prevented from sinking in so that the dimensional accuracy of the semiconductor device is improved. Other features and effects are similar to those of the first embodiment. For the fastening of the lid 9, an adhesive or screw may be used.

Third Embodiment

Figure 3:
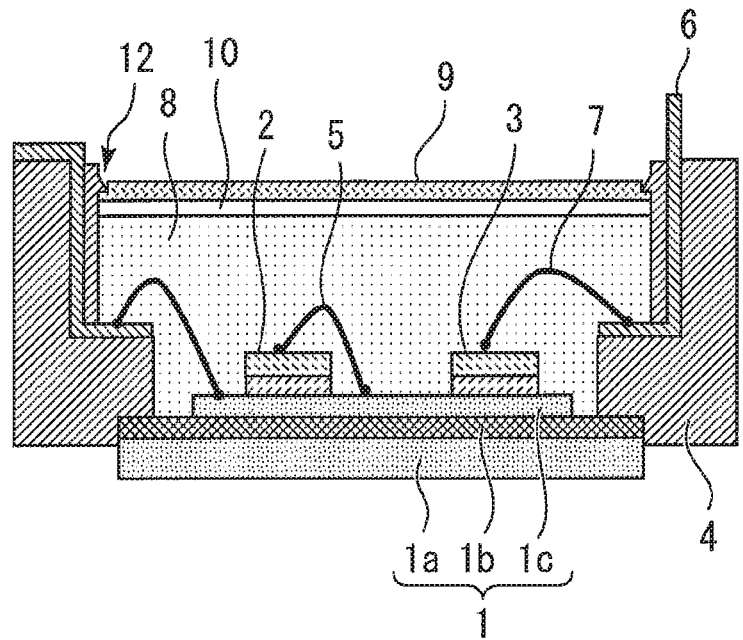
FIG. 3 is a cross-sectional view illustrating a semiconductor device according to a third embodiment.
Figure 4:
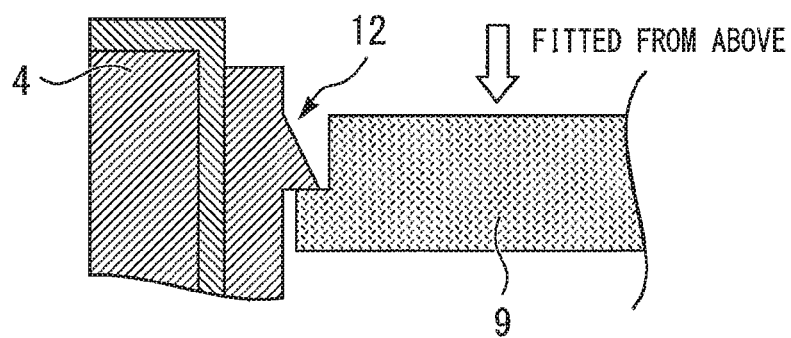
FIG. 4 is a cross-sectional view illustrating the snap-fit structure in FIG. 3 to a larger scale.

FIG. 3 is a cross-sectional view illustrating a semiconductor device according to a third embodiment. FIG. 4 is a cross-sectional view illustrating the snap-fit structure in FIG. 3 to a larger scale. A snap-fit structure 12 is provided on an inner side face of the case 4 for fixing the lid 9 fitted from above. This facilitates the assembling process of the semiconductor device. Other features and effects are similar to those of the first embodiment.

Fourth Embodiment

Figure 5:
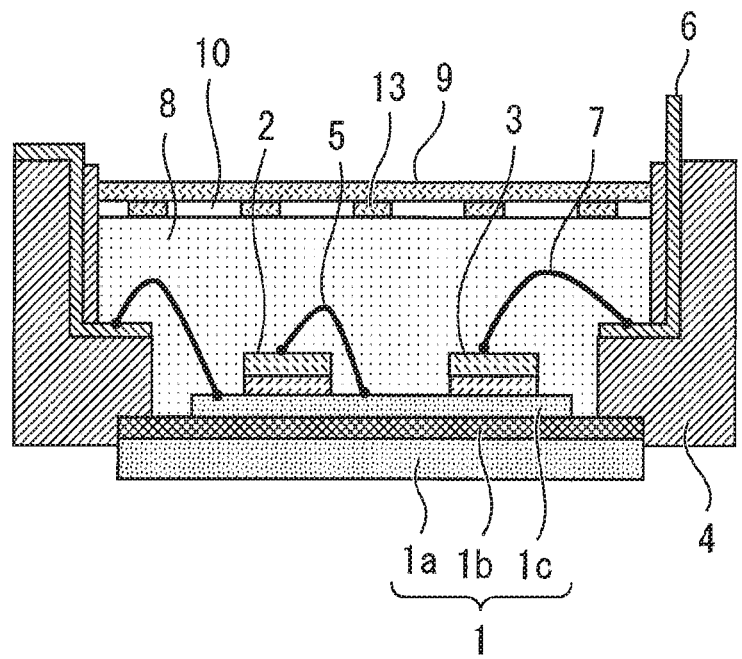
FIG. 5 is a cross-sectional view illustrating a semiconductor device according to a fourth embodiment.

FIG. 5 is a cross-sectional view illustrating a semiconductor device according to a fourth embodiment. A plurality of protruded parts 13 are provided on the lower face of the lid 9, and the lower faces of the protruded parts 13 are in contact with the upper surface of the sealing material 8. The height of the lid 9 from the sealing material 8 can be made uniform by these protruded parts 13, so that the dimensional accuracy of the semiconductor device is improved. Also, the assembling process can be made easy by bonding the protruded parts 13 of the lid 9 to the sealing material 8 during the setting of the sealing material 8. Other features and effects are similar to those of the first embodiment. The protruded parts 13 may be bonded to the sealing material 8 using an adhesive.

Fifth Embodiment

Figure 6:
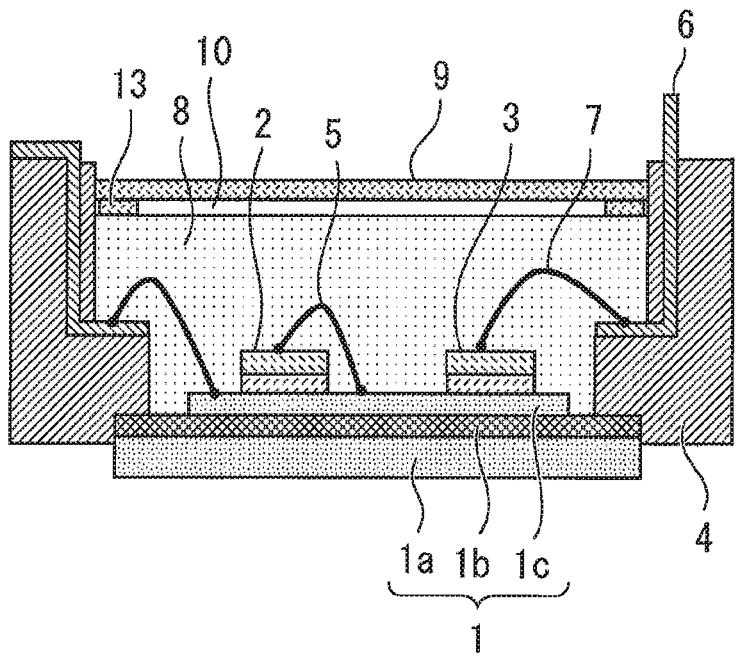
FIG. 6 is a cross-sectional view illustrating a semiconductor device according to a fifth embodiment.

FIG. 6 is a cross-sectional view illustrating a semiconductor device according to a fifth embodiment. The protruded parts 13 are provided only in an outer circumferential part of the lid 9. This facilitates the positioning so that assembling efficiency is improved. Other features and effects are similar to those of the fourth embodiment.

Sixth Embodiment

Figure 7:
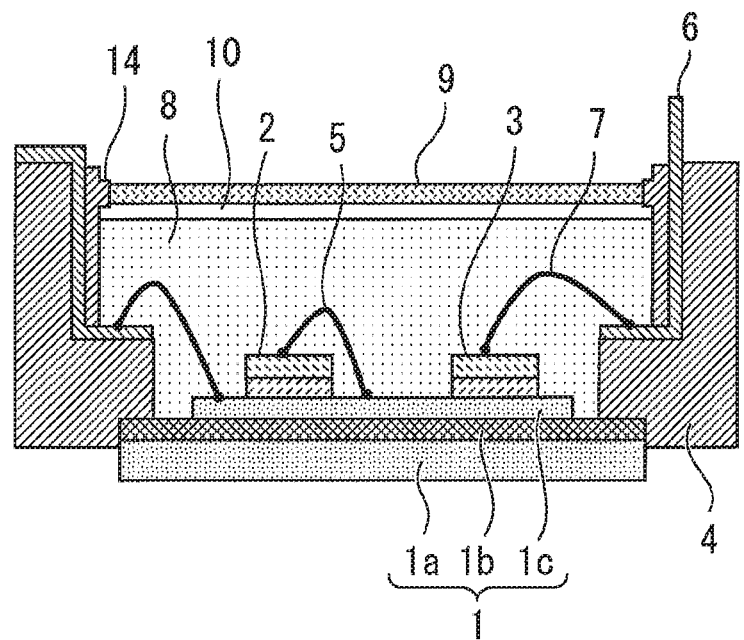
FIG. 7 is a cross-sectional view illustrating a semiconductor device according to a sixth embodiment.
Figure 8:
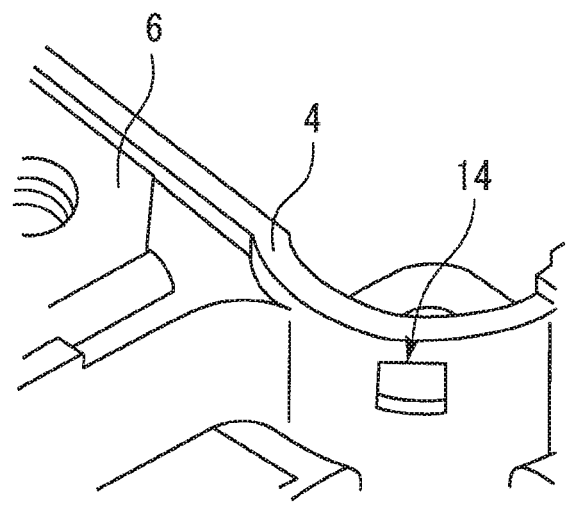
FIG. 8 is a cross-sectional view illustrating the protrusion in FIG. 7 to a larger scale.

FIG. 7 is a cross-sectional view illustrating a semiconductor device according to a sixth embodiment. FIG. 8 is a cross-sectional view illustrating the protrusion in FIG. 7 to a larger scale. Protrusions 14 are provided on an inner side face of the case 4. The lid 9 is fastened to the case 4 by a press-fit with the protrusions 14. The lid 9 can thereby be firmly fixed to the case 4. The lid 9 is also prevented from lifting up. Other features and effects are similar to those of the first embodiment.

Seventh Embodiment

Figure 9:
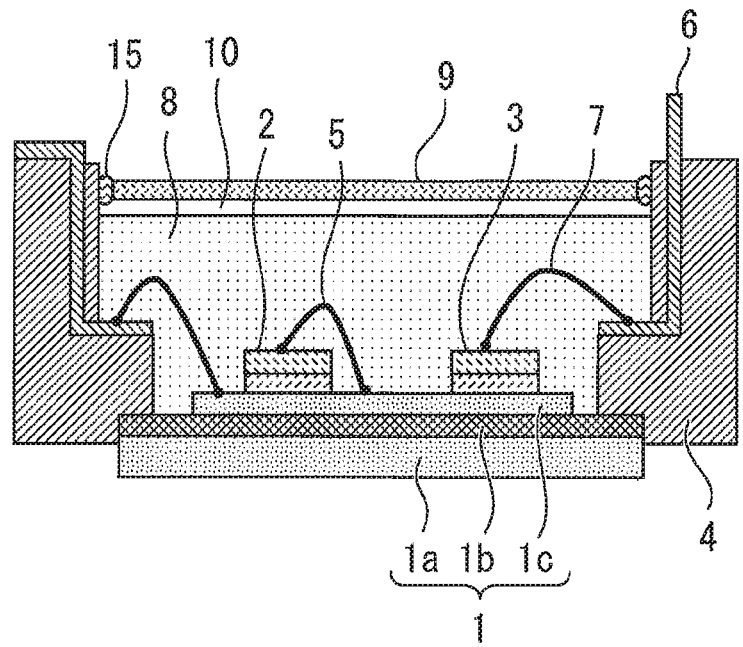
FIG. 9 is a cross-sectional view illustrating a semiconductor device according to a seventh embodiment.

FIG. 9 is a cross-sectional view illustrating a semiconductor device according to a seventh embodiment. The lid 9 is fastened to the case 4 with an adhesive 15. The lid 9 can thereby be firmly fixed to the case 4. Other features and effects are similar to those of the first embodiment.

Eighth Embodiment

Figure 10:
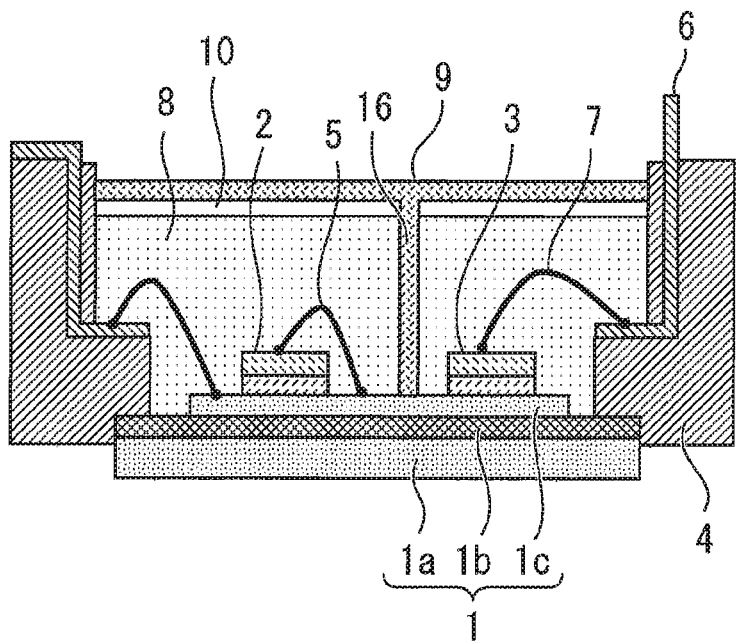
FIG. 10 is a cross-sectional view illustrating a semiconductor device according to an eighth embodiment.

FIG. 10 is a cross-sectional view illustrating a semiconductor device according to an eighth embodiment. A column 16 is provided to the lower face of the lid 9 and extends to the upper face of the base plate 1. The column 16 is made of the same material as that of the lid 9. The height of the lid 9 from the base plate 1 is thereby fixed, and the lid 9 is prevented from sinking in, so that the dimensional accuracy of the semiconductor device is improved. Also, the assembling process can be made easy by bonding the lid 9 to the sealing material 8 during the setting of the sealing material 8. Other features and effects are similar to those of the first embodiment.

Ninth Embodiment

Figure 11:
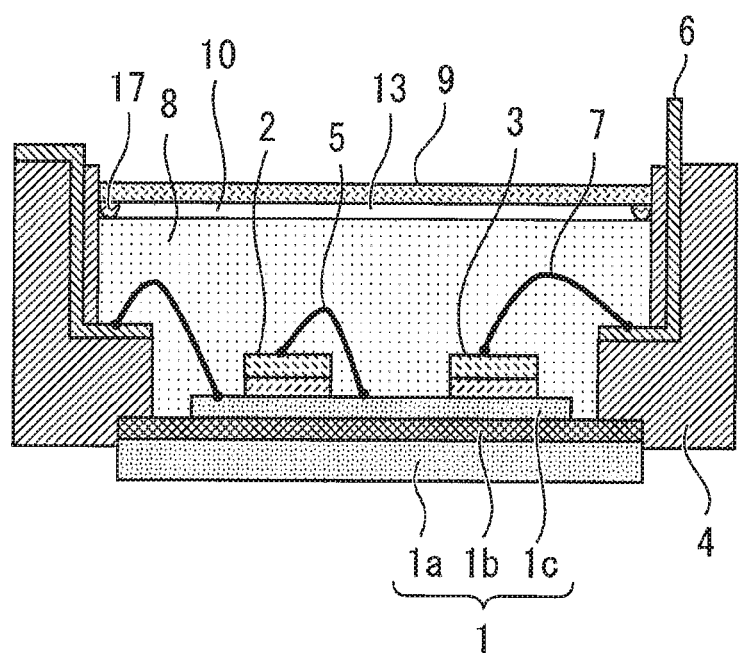
FIG. 11 is a cross-sectional view illustrating a semiconductor device according to a ninth embodiment.

FIG. 11 is a cross-sectional view illustrating a semiconductor device according to a ninth embodiment. An adhesive 17 is provided between the upper face of the sealing material 8 and the lower face of the lid 9. The lid 9 can thereby be firmly fastened, while it is ensured that the gap 10 is formed. Other features and effects are similar to those of the first embodiment.

The semiconductor chips 2 and 3 are not limited to semiconductor chips formed of silicon, but instead may be formed of a wide-bandgap semiconductor having a bandgap wider than that of silicon. The wide-bandgap semiconductor is, for example, a silicon carbide, a gallium-nitride-based material, or diamond. Since the semiconductor chips 2 and 3 formed of such a wide-bandgap semiconductor operate at a high temperature, these embodiments are particularly effective. A semiconductor chip formed of such a wide-bandgap semiconductor has a high voltage resistance and a high allowable current density, and thus can be miniaturized. The use of such a miniaturized semiconductor chip enables the miniaturization and high integration of the semiconductor device in which the semiconductor chip is incorporated. Further, since the semiconductor chip has a high heat resistance, a radiation fin of a heatsink can be miniaturized and a water-cooled part can be air-cooled, which leads to further miniaturization of the semiconductor device. Further, since the semiconductor chip has a low power loss and a high efficiency, a highly efficient semiconductor device can be achieved.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2017-197913, filed on Oct. 11, 2017 including specification, claims, drawings and summary, on which the Convention priority of the present application is based, is incorporated herein by reference in its entirety.

The invention claimed is:

1. A semiconductor device comprising:
a base plate;
a semiconductor chip mounted on the base plate;
a case surrounding the semiconductor chip on the base plate;
an electrode terminal connected to the semiconductor chip;
a sealing material covering an upper face of the base plate, the semiconductor chip and a part of the electrode terminal in the case; and
a lid fastened to the case above the sealing material, the lid having a lower surface that faces the sealing material and an upper surface opposite to the lower surface, the lower surface extending planar from a location above the sealing material to a side edge of the lid, and the upper surface having a stepped-portion extending from the side edge of the lid;
a snap-fit structure that extends outwardly from an inner side face of the case into an interior opening within the case for fixing the lid to the case, the snap-fit structure having a lower surface that faces the sealing member and contacts the stepped portion of the upper surface of the lid that faces away from the sealing member, to fasten the lid to the case,
wherein the electrode terminal is not exposed on an upper face of the sealing material,
there is a gap between the upper face of the sealing material and the lower surface of the lid, a size of the gap at a corner of the lid at which the lower surface of the lid meets the side edge of the lid being equal to a size of the gap at another portion of the lower surface of the lid closer to the center of the lid, and
the snap-fit structure has an upper angled surface opposite to the lower surface.

2. The semiconductor device according to claim 1, wherein the base plate is a resin-insulated Cu base plate including a Cu base plate, a resin insulating layer, and a circuit pattern stacked upon one another and formed as an integral plate, and
the sealing material is an epoxy resin.

3. The semiconductor device according to claim 1, wherein the lid is made of a poly phenylene sulfide resin.

4. The semiconductor device according to claim 1, wherein the lid includes a metal sheet.

5. The semiconductor device according to claim 1, wherein the semiconductor chip is made of a wide-band-gap semiconductor.

6. A semiconductor device comprising:
a base plate having an upper face, and a wiring pattern disposed on the upper face;
a semiconductor chip mounted on an upper surface of the wiring pattern disposed on the upper face of the base plate;
a case surrounding the semiconductor chip on the base plate;
an electrode terminal connected to the semiconductor chip;
a sealing material covering the upper face of the base plate, the semiconductor chip and a part of the electrode terminal in the case; and
a lid fastened to the case above the sealing material,
wherein the electrode terminal is not exposed on an upper face of the sealing material,
there is a gap between the upper face of the sealing material and a lower face of the lid, and
a column is provided to the lower face of the lid and extends into direct contact with the upper surface of a circuit pattern disposed on the upper face of the base plate.

7. A semiconductor device comprising:
a base plate;
a semiconductor chip mounted on the base plate;
a case surrounding the semiconductor chip on the base plate;
an electrode terminal connected to the semiconductor chip;
a sealing material covering an upper face of the base plate, the semiconductor chip and a part of the electrode terminal in the case; and
a lid fastened to the case above the sealing material,
wherein the electrode terminal is not exposed on an upper face of the sealing material,
there is a gap between the upper face of the sealing material and a lower face of the lid, and
an adhesive is provided in direct contact with the upper face of the sealing member and the lower face of the lid to attach the upper face of the sealing material to the lower face of the lid.

* * * * *